(12) United States Patent
Jewram et al.

(10) Patent No.: US 6,657,297 B1
(45) Date of Patent: Dec. 2, 2003

(54) FLEXIBLE SURFACE LAYER FILM FOR DELIVERY OF HIGHLY FILLED OR LOW CROSS-LINKED THERMALLY CONDUCTIVE INTERFACE PADS

(75) Inventors: Radesh Jewram, Lakeville, MN (US); Kasyap Venkata Seethamraju, Woodbury, MN (US); Kevin L. Hanson, Bloomington, MN (US)

(73) Assignee: The Bergquist Company, Chanhassen, MN (US)

( * ) Notice: Subject to any disclaimer, the term of this patent is extended or adjusted under 35 U.S.C. 154(b) by 0 days.

(21) Appl. No.: 10/219,210

(22) Filed: Aug. 15, 2002

(51) Int. Cl.[7] .............................................. H01L 23/34
(52) U.S. Cl. .................... 257/720; 257/684; 257/712; 428/620
(58) Field of Search ................................ 257/720, 684, 257/712

(56) References Cited

U.S. PATENT DOCUMENTS

| | | | |
|---|---|---|---|
| 4,938,992 A | * | 7/1990 | Mears .......................... 427/578 |
| 5,300,809 A | * | 4/1994 | Nakamura et al. ........... 257/684 |
| 5,679,457 A | | 10/1997 | Bergerson |
| 5,738,936 A | * | 4/1998 | Hanrahan ................. 428/313.5 |
| 5,950,066 A | | 9/1999 | Hanson et al. |
| 6,090,484 A | | 7/2000 | Bergerson |
| 6,165,612 A | | 12/2000 | Misra |
| 6,344,104 B1 | | 2/2002 | Sekiya et al. |
| 6,359,334 B1 | * | 3/2002 | Jiang ........................... 257/706 |
| 6,399,209 B1 | | 6/2002 | Misra et al. |

* cited by examiner

Primary Examiner—David Nelms
Assistant Examiner—Tu-Tu Ho
(74) Attorney, Agent, or Firm—Haugen Law Firm LLP

(57) ABSTRACT

A flexible plastic thermally conductive multilayer semiconductor mounting pad having a highly thermally conductive bulk layer with thermally conductive surface skin layers bonded integrally to opposed major surfaces thereof. The bulk layer and the surface skin layers are each filled with a finely divided thermally conductive particulate, with the skin layers being harder than the bulk layer and being blended with an amount of filler which is less than that present in the bulk layer.

13 Claims, 1 Drawing Sheet

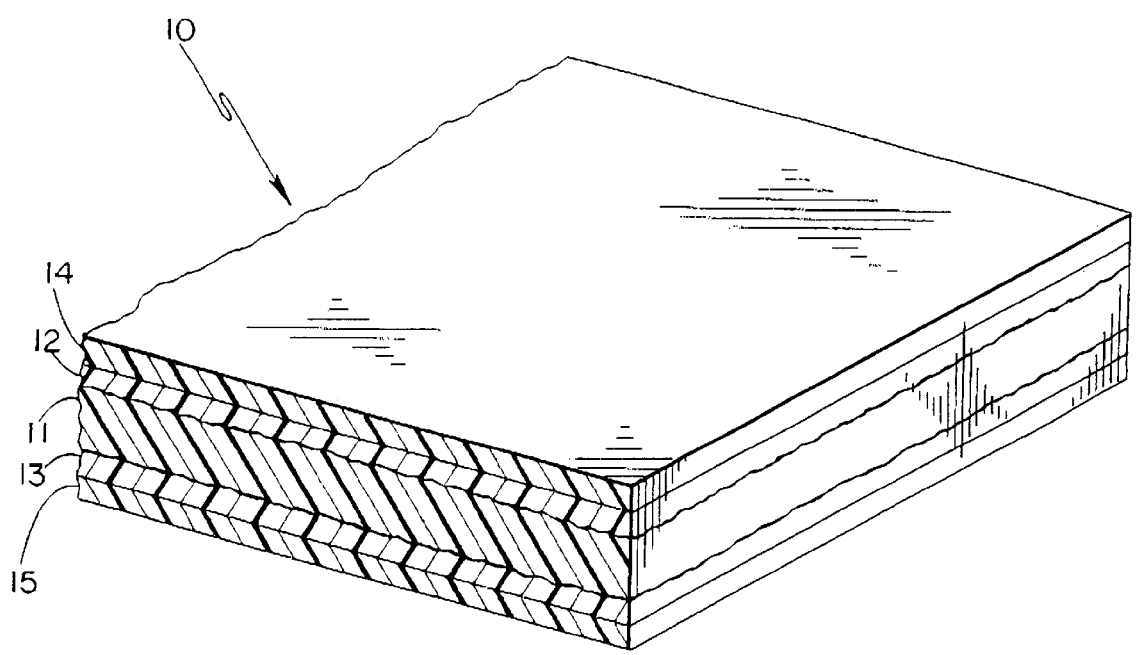

FLEXIBLE SURFACE LAYER FILM FOR DELIVERY OF HIGHLY FILLED OR LOW CROSS-LINKED THERMALLY CONDUCTIVE INTERFACE PADS

BACKGROUND OF THE INVENTION

The present invention relates generally to an improved composite material for use as an interface or in forming a mounting pad to be interposed along a heat dissipating path between a solid state electronic device and a heat sinking surface. The composite consists of a multi-layer pad flanked by skin layers which may be different in chemical composition and/or physical properties integrally bonded to and mated with the bulk layer so as to form a composite having good mechanical properties along with excellent thermal properties. The composites of the present invention are useful in the production and manufacturing of electronic systems inasmuch as the skin layers are well adapted to receive and reasonably hold a release liner, which is readily removable from the composite during or following production and handling operations.

In order to enhance the thermal properties of interface mounting pads, it is generally the practice to increase the particulate loading of the resin system of a composite. Increased loading, while improving the thermal properties, generally has an adverse effect upon the mechanical properties. To decrease hardness of highly filled composites, it is customary to reduce cross-linking of the resin system or use gel-like resins. In this connection, excessive loading and light cross-linking typically leads to a reduction in the cohesive strength of the blend, so that the product becomes difficult and/or impossible to handle in production operations. By way of example, the effective use of a release film is impeded because of the tendency for portions of the mounting pad to adhere to the release film upon removal. Also, the pad can tear while it is being pulled a liner due to its low cohesive strength. Loss of portions of the pad renders the structure unusable for its intended purpose due to the creation of air entraining voids. Surface disruptions of any sort are, of course, unacceptable for interface mounting pads. The present invention aims to produce a pad that is soft, highly filled and can be easily processed in a production operation.

The bulk layer may comprise a silicone elastomer containing thermally conductive fillers such as, for example, alumina, boron nitride, aluminum nitride, graphite, zinc oxide, aluminum, copper powder, silver powder and other thermally conductive ceramics or metals including blends or mixtures thereof. As indicated above, however, the bulk layer employs a high concentration of such fillers. Alternative resins for the bulk and surface layers that may be useful are polyethylene, epoxy, acrylic, polyurethane, polyester, or polybutadiene. The bulk layer has a thermal conductivity in the range of 1–15 W/m.K. with a hardness ranging from between about 10–80 Shore 00. The thickness of the bulk layer will typically range from between about 10 and 250 mils.

The surface or skin layers are likewise filled with similar conductive fillers. The skin layer may employ the same resin system as the bulk layer, with distinctively different mechanical properties. Other resin systems including epoxy, acrylic, polyurethane, polyester or elastomeric rubbers compatible with that of the bulk may also be employed. The skin layer typically has a thermal conductivity ranging from between about 0.3–5 W/m.K. with a significantly higher hardness than that of the bulk, such as in the range of between about 30 Shore 00 to 60 Shore A. The properties of the skin layer permit it to be applied as a hot-melt of flexible film, thereby not adversely affecting the overall thermal performance of the bulk or center layer. Furthermore, it neither alters nor increases the hardness of the bulk material inasmuch as the skin layer is typically between about 2 and 50 microns in thickness.

SUMMARY OF THE INVENTION

The thermal interface pads of the present invention are particularly useful in those applications requiring a pad of low hardness. The composite of the present invention has other desirable physical properties due to the formation of skin layers with good strength and. flexibility. These features render the entire composite dimensionally stable, in spite of the utilization of a bulk or center layer of low cohesive strength and otherwise poor mechanical strength. Furthermore, the properties of the skin layer are such that it eliminates the problem of the bulk layer having a tendency to stick, adhere to, or otherwise block liner surfaces including such typical liner materials as standard silicone release liners and Teflon®, thus rendering materials of the present invention readily removable from the liner after processing or following a particular end use operation or step. Furthermore, the presence of the high strength skin layer makes it possible to easily remove the entire composite from standard silicone release liners. The properties of the skin layer also gives the entire composite sufficient dimensional stability to withstand typical pick-and-place production applications.

The properties of the skin layer permit and make possible the manufacturing and utilization of highly filled and/or low cross-linked materials. In this connection, therefore, the interface pads prepared in accordance with the present invention will flow and otherwise conform to any microvoid or deformity in the surface against which it is placed in the mounting operation. Therefore, interface devices prepared in accordance with the present invention will utilize a skin layer having a greater modulus than the bulk, as well as greater flexibility. This property significantly reduces interfacial thermal resistance and accordingly enhances thermal performance of the entire composite for thermal management purposes.

Therefore, it is a primary object of the present invention to provide an improved interface mounting pad to be interposed between opposed surfaces of a solid state electronic device and a heat dissipating surface, with the pad consisting of a highly filled central bulk layer with low cohesive strength flanked by less highly filled bulk layers having good thermal properties along with excellent mechanical properties, so as to enhance the mechanical strength of the overall composite.

It is yet a further object of the present invention to provide an improved thermal interface pad for use in mounting semiconductor devices to surfaces of a heat sink, with the composite having excellent thermal properties along with good mechanical properties including cohesive strength.

Other and further objects of the present invention will become apparent to those skilled in the art upon a study of the following specification, appended claims, and accompanying drawings.

IN THE DRAWING

The drawing is a perspective view, partially in section, and on an enlarged scale illustrating a typical interface mounting pad prepared in accordance with the present invention, with the individual layers being shown in section.

DESCRIPTION OF THE PREFERRED EMBODIMENT

In accordance with the preferred embodiment of the present invention, and illustrated in the drawing, a flexible plastic thermally conductive multi-layer interface pad generally designated 10 is illustrated. Pad 10 comprises a center or bulk layer 11 flanked by a pair of thermally conductive surface skin layers 12 and 13 integrally bonded to opposed major surfaces of central bulk layer 11. Additionally, release liners 14 and 15 are disposed on the outer surfaces of skin layers 12 and 13, thereby providing a protective layer for the surfaces of the skin layers.

The bulk layer preferably comprises a blend of siloxane polymers, including vinyl and hydride terminated polymethylsiloxanes heavily filled with a finely divided thermally conductive particulate. For most applications, and assuming alumina as the particulate with a density of 3.75, the particulate present in the siloxane resin in a range from between about 500 Phr to 2300 Phr. On a volumetric scale, the particulate is present in an amount ranging from between about 10 to 85% filler by volume, with a range of between 20% and 80% being preferred. In certain applications, the particulate may be selected as a blend of particulate made up of two separate size ranges. In one such application, the larger particulate has an average diameter of about 50 microns, which is blended with smaller particulate having an average diameter of approximately 2 microns. For most applications, a somewhat larger particulate is utilized in the bulk layer, generally greater than 2 microns. In those applications where it is utilized, the blend of particulate assists in enhancing the thermal properties of the bulk layer, with bi and tri models also being useful.

The skin layers have different physical and/or chemical properties than the bulk compatible with the bulk layer. Because of its higher cohesive strength, the skin improves the physical properties of the overall pad. The blend of materials for the surface skin layers includes thermally conductive particulate filler in a lesser quantity than in the bulk, preferably in a range of between about 5% and 60% by volume, with a range of between 10% and 40% being preferred.

In overall preparation, it has been found preferable to utilize a calendering operation to mate the skin layers with the bulk layer. Other laminating operations may be employed, if desired. For ease of material handling, it is, of course, preferable that a release liner be applied to the outer surfaces of the skin layers in order to expedite the laminating or mating operation.

EXAMPLES

In order to facilitate an explanation of the operation undertaken to prepare the multi-layer interface pads of the present invention, the following specific examples are provided.

(A) BULK LAYER

Example I

| Material | Parts by Weight, Grams |
| --- | --- |
| Silicone elastomer with modulus of 5–30 kPa (1–5 psi) | 100 |
| Alumina powder fillers | 1200. |

In actual preparation, the reactant mixture is prepared by thoroughly blending the resin components and fillers. Thereafter, the reaction inhibitor and catalyst are added. Thereafter, the reactant product is rolled or otherwise leveled to a pad having a thickness of the desired thickness, in this case, 10–250 mils. This pad is highly filled, having low degree of cross-linking and with a hardness of 30–60 Shore 00 and generally about 50 Shore 00. The mechanical properties render this pad difficult to release off Teflon® liners due primarily to its low cohesive strength. The addition of the skin layer facilitates the easy release of the composite from a liner, and facilitates handling. A silicone release liner with coated skin layer also helps in the production of a pad using silicone gel resins in the above example.

In modified versions of the formulation of Example I, the alumina powder filler may be increased to an amount up to 2000 parts by weight (grams) depending upon the thermal requirements and physical properties desired in the bulk layer.

Example II

| Material | Parts by Weight, Grams |
| --- | --- |
| Silicone elastomer with modulus of 5–30 kPa (1–5 psi) | 100 |
| Alumina powder filler | 224. |

In actual preparation, the reactant mixture is prepared by thoroughly blending the resin components and fillers. Thereafter, the reaction inhibitor and catalyst are added, after which the reactant product is leveled or rolled to a pad having a thickness of about 10–250 mils. This bulk material is lightly cross-linked and soft with a target hardness of 40 Shore 00. This product releases well from Teflon® but not from standard silicone release liners.

Example III

| Material | Parts by Weight, Grams |
| --- | --- |
| Silicone elastomer with modulus of 5–30 kPa (1–5 psi) | 100 |
| Alumina powder | 242. |
| Alumina trihydrate powder | 143. |

In actual preparation, the reactant mixture is prepared by thoroughly blending the resin components and fillers. Thereafter, the reaction inhibitor and catalyst are added, after which the reactant product is rolled to a pad having a desired thickness of about 10–250 mils. This is a low fill and elastic bulk material. Its adhesion property which is greater than 50 g/in. on the liner surface will result in stretching and severe deformation of the material. This makes it impossible to use after removal from the liners. The skin layers reduce the entire composite release off standard liners to less than 30 g/in.

Example IV

| Material | Parts by Weight, Grams |
| --- | --- |
| Polybutadiene resin | 100 |
| Antioxidant | 2 |
| Catalyst | 1.5 |
| Alumina fillers | 600. |

This formula has a hardness of about 70 Shore 00. The material adheres or sticks to commercially available release liners and results in deformation of the pads at thicknesses of 10–60 mils. The skin layer facilitates easy release from standard silicone release liners at less than 30 g/in. peel.

In certain formulations based upon this Example IV, the quantity of alumina filler may be reduced to 200 parts by weight (grams) depending upon the required thermal conductivity. Such formulations typically have a hardness of about 40 Shore 00 and may be provided with a skin layer to facilitate easy release from standard silicone release liners.

(B) SKIN LAYER

Example V

| Material | Parts by Weight, Grams |
| --- | --- |
| Microcrystalline wax | 70 |
| Ethylene-vinyl acetate copolymer (EVA) | 90 |
| Aliphatic c-5 petroleum hydrocarbon resin | 100 |
| Aromatic modified c-5 hydrocarbon resin | 100 |
| Alumina | 555. |

The microcrystalline wax selected in this example has a melting point of 55° C. and is commercially available under the trade designation "M-7332" from Moore and Munger Co. of Hartford, Conn.

In certain variations of the formulation of this Example V, the alumina content may range from between 100 parts by weight (grams) to an amount up to 720 parts by weight (grams) depending upon the requisite thermal performance and physical properties.

Example VI

| Material | Parts by Weight, Grams |
| --- | --- |
| Microcrystalline wax (as in Example V) | 70 |
| Ethylene-vinyl acetate copolymer | 90 |
| Aliphatic c-5 petroleum hydrocarbon resin | 100 |

-continued

| Material | Parts by Weight, Grams |
| --- | --- |
| Aromatic modified c-5 hydrocarbon resin | 100 |
| Graphite | 90. |

The formulation of Example V (skin) was further modified by lowering the quantity of thermally conductive particulate filler employed was graphite in the quantity indicated. Results were comparable to that of Example V (skin) but with slightly higher cohesive strength.

In variations of the formulation of this Example VI, the graphite may be present in a range of between about 90 and 150 grams, but preferably in a range of about 20% by volume. The quantity of graphite is dependent upon the thermal performance and physical properties desired.

Example VII

| Material | Parts by Weight, Grams |
| --- | --- |
| Microcrystalline wax (melting point 55° C.) | 10 |
| Silicone wax (melting point 65° C.) | 25 |
| Alumina particulate | 190. |

This formulation enables better mating with the silicone bulk layers and also provides hard protective layers.

Example VIII

| Material | Parts by Weight, Grams |
| --- | --- |
| Silicone elastomer with modulus of 30–70 kPa (5–10 psi) | 100 |
| Alumina powder fillers | 150. |

The formulation of Example VIII is utilized to prepare skin layers for use with selected bulk layers, it being noted that the elastomer selected for the bulk layer will always have a modulus significantly less than that of the skin layer. In this connection, the silicone elastomer selected for the skin layer will typically have a modulus of between about 20–70 kPa (5–10 psi) greater than that of its mated bulk layer.

Example IX

| Material | Parts by Weight, Grams |
| --- | --- |
| Silicone elastomer with modulus of 70–100 kPa (10–15 psi) | 100 |
| Alumina powder fillers | 150. |

The formulation of Example IX was similar to that of Example VIII with the exception of the silicone elastomer selected. In the formulation of Example IX, the selected silicone elastomer had a modulus of 100–140 kPa (15–20 psi). The results achieved with the skin material prepared from this formulation exhibited an increased hardness over that obtained from the formulation of Example VIII.

Each of the skin layer reactant products of Examples I through IX inclusive may be applied to a release film at a desired thickness, and thereafter placed in face-to-face contact with the bulk layer to form upper and lower skins of a pre-form. Similar or selected different skins may be utilized for a given bulk layer, with the skin selection depending, of course, upon the requirements of the ultimate application, including mechanical properties such as hardness, thermal properties, and the like. With the release films in place on the outer surfaces, the pre-form is then calendered to a desired finished thickness, with handling being facilitated by the presence of the release liners. Release liners employed with the skin layers of the present invention are preferably fabricated from standard silicone films or a polyester film such as stress-oriented polyethylene terephthalate (Teflon®).

BONDING TECHNIQUE

A skin layer comprising the reactant product of Example IV was applied to the opposed major surfaces of the bulk layer of Example I, with each exposed skin layer being covered with a release liner of 1–5 mil silicone release liner. A 3-mil silicone release liner has been found well adapted for use with skin layers of between 0.3 mils and 3 mils. This composite was then passed through a pair of coordinated pinch rolls and compressed to an overall thickness of 5–20. The resultant was a highly uniform flexible mounting pad having an overall or composite thermal conductivity of 0.5–25 W/m–K. In one application, a bulk layer having a thickness of 38 mils (Example I) was flanked by skin layers of 1.0 each (Example IV) each with release liners of 3.0 mil silicone was passed through a pair of coordinated pinch rolls and compressed to an overall thickness of 40 mils. It will be appreciated that the ultimate thickness of the composite laminate is determined by the specific application contemplated for the product.

The mechanical properties of the pads were excellent, with the release liner being readily removable from the skin surface layers without any evidence of blocking.

For most applications, the bulk layer will preferably have a thickness of between about 5 and 250 mils, with a compatible skin being applied thereto. For most purposes, a skin thickness ranging from between about 0.1 and 2 mils has been found useful. It will be appreciated that the actual thickness selected for the laminates having the thinner bulk material will accordingly have the thinner skins applied thereto. The converse is true for those components with greater thickness dimensions.

It will be appreciated, therefore, that the above examples are presented for illustration purposes only and are not to be construed as a limitation upon the scope of the claims to which this invention may be otherwise entitled.

What is claimed is:

1. In a flexible plastic thermally conductive multi-layer semiconductor mounting pad having a highly thermally conductive bulk layer with thermally conductive surface skin layers bonded integrally to at least one of a pair of opposed major surfaces thereof, said semiconductor mounting pad being characterized in that:

(a) said central bulk layer being filled with a finely divided thermally conductive particulate, and comprising a flexible polymeric resin matrix selected from the group consisting of silicone, epoxy, acrylic, polyurethane, polyester, and polybutadiene;

(1) said particulate being present in said polymeric matrix in an amount ranging from between about 10% and 85% by volume and being sufficient in amount to produce a bulk layer having a hardness of between 10–80 Shore 00;

(b) said surface skin layers having a thickness of between 2 and 50 microns and selected from a polymeric resin being compatible with the polymeric matrix of said bulk layer and selected from the group consisting of silicone, epoxy, acrylic, polyurethane, polyester, and polybutadiene, and with said surface layers being blended with a thermally conductive finely divided particulate filler in an amount ranging less than that present in said bulk layer and ranging from between about 5% and 60% by volume;

(1) the hardness of said skin layer being substantially greater than that of the bulk layer, and ranging from between about 20 Shore 00 and 60 Shore A.

2. The semiconductor mounting pad as set forth in claim 1 wherein the polymeric resin selected for said bulk and skin layers is a blend of silicone elastomer and thermally conductive filler.

3. The semiconductor mounting pad as set forth in claim 1 wherein the polymeric resin selected for said skin layer is ethylene vinyl acetate co-polymer and said bulk layer is silicone elastomer.

4. The semiconductor mounting pad as set forth in claim 1 wherein said finely divided thermally conductive particulate filler is selected from the group consisting of alumina, boron nitride, aluminum nitride, graphite, silicon carbide, zinc oxide, copper powder, aluminum powder, and silver powder, other metallic powders, and blends thereof.

5. The semiconductor mounting pad as set forth in claim 1 wherein said finely divided particulate filler selected for said bulk and skin layers is alumina.

6. The semiconductor mounting pad as set forth in claim 1 wherein said finely divided thermally conductive particulate filler is a metallic powder selected from the group consisting of aluminum, copper and silver.

7. The semiconductor mounting pad as set forth in claim 1 wherein said bulk layer has a thermal conductivity ranging from between about 1 and 15 W/m.K.

8. The semiconductor mounting pad as set forth in claim 7 wherein said skin layers have a thermal conductivity ranging from between about 0.3–5 W/m.K.

9. The semiconductor mounting pad as set forth in claim 2 wherein said finely divided particulate filler is alumina.

10. The semiconductor mounting pad of claim 9 wherein said filler is present in said polymeric matrix in an amount ranging from between 20% and 50% by volume and wherein said polymeric matrix has a hardness ranging from between 20–50 Shore 00.

11. The semiconductor mounting pad of claim 10 wherein said finely divided particulate filler in said skin layers is present in an amount ranging from between 20% and 40% by volume.

12. The semiconductor mounting pad of claim 1 wherein a thermally conductive surface skin layer is bonded integrally to each of said opposed major surfaces of said bulk layer, and wherein the polymeric matrix for each skin layer is a different polymer.

13. The semiconductor mounting pad of claim 1 wherein a thermally conductive surface skin layer is bonded integrally to each of said opposed major surfaces, and wherein one of said skin layers is blended with a significantly greater amount of finely divided particulate filler than the other skin layer.

* * * * *